United States Patent
Wood et al.

(10) Patent No.: US 7,667,320 B2
(45) Date of Patent: *Feb. 23, 2010

(54) INTEGRATED CIRCUIT PACKAGE WITH IMPROVED POWER SIGNAL CONNECTION

(75) Inventors: Dustin P. Wood, Chandler, AZ (US); Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 186 days.

This patent is subject to a terminal disclaimer.

(21) Appl. No.: 12/022,254

(22) Filed: Jan. 30, 2008

(65) Prior Publication Data

US 2008/0136010 A1 Jun. 12, 2008

Related U.S. Application Data

(60) Continuation of application No. 11/652,425, filed on Jan. 11, 2007, now Pat. No. 7,348,214, which is a division of application No. 10/831,795, filed on Apr. 26, 2004, now Pat. No. 7,183,644.

(51) Int. Cl.
*H01L 23/34* (2006.01)

(52) U.S. Cl. ..................... 257/724; 257/691; 257/532

(58) Field of Classification Search ................. 257/723, 257/724, 532, 691, 786, 777, 686

See application file for complete search history.

(56) References Cited

U.S. PATENT DOCUMENTS

| | | | |
|---|---|---|---|
| 5,642,262 | A | 6/1997 | Terrill et al. |
| 5,798,567 | A | 8/1998 | Kelly et al. |
| 6,330,164 | B1 | 12/2001 | Khandros et al. |
| 6,400,576 | B1 | 6/2002 | Davidson |
| 6,535,398 | B1 | 3/2003 | Moresco |
| 7,183,644 | B2 * | 2/2007 | Wood et al. .................. 257/724 |
| 2002/0017700 | A1 | 2/2002 | Mori et al. |
| 2003/0110452 | A1 | 6/2003 | Leahy et al. |
| 2003/0198033 | A1 | 10/2003 | Panella et al. |
| 2003/0218235 | A1 | 11/2003 | Searls et al. |
| 2004/0012085 | A1 | 1/2004 | Shioga et al. |

OTHER PUBLICATIONS

"PCT Notification of Transmittal of the International Search Report", mailed Jul. 27, 2005, for PCT/US2005/012072.

* cited by examiner

*Primary Examiner*—S. V Clark
(74) *Attorney, Agent, or Firm*—Buckley, Maschoff & Talwalkar LLC

(57) ABSTRACT

An integrated circuit (IC) package includes a substrate and an IC die mounted on a first side of the substrate. The IC package also includes a plurality of capacitors mounted on a second side of the substrate. The second side is opposite to the first side. The IC package further includes a plurality of conductive contact pads formed on the second side of the substrate and interspersed among the capacitors. Other embodiments are described and claimed.

3 Claims, 5 Drawing Sheets

US 7,667,320 B2

INTEGRATED CIRCUIT PACKAGE WITH IMPROVED POWER SIGNAL CONNECTION

CROSS REFERENCE TO RELATED APPLICATION

This is a continuation of prior U.S. patent application Ser. No. 11/652,425, filed on Jan. 11, 2007, which is a divisional of prior U.S. patent application Ser. No. 10/831,795, filed on Apr. 26, 2004, now U.S. Pat. No. 7,183,644.

BACKGROUND

As the operating speed of microprocessors continues to increase, the current drawn by the microprocessor tends to escalate. Increasing current tends to amplify the power supply noise which may limit processor performance. High frequency power supply noise or "first droop" is generally proportional to the rate of change of current and is managed by using decoupling capacitors installed in the center of the "land" side of the package substrate at the location of a cavity in the socket on the motherboard. On the other hand, low frequency power supply noise or "third droop" is proportional to the current drawn by the microprocessor and is usually managed by minimizing the total path resistance from the voltage regulator (VR) on the board to the microprocessor die. However, typical die packaging arrangements tend to make it difficult to achieve this goal of minimizing the resistance without resorting to costly measures such as (a) increasing the number of layers in the package substrate; (b) increasing the thickness of the metal layers in the package substrate; (c) increasing the number of socket contacts; and/or (d) increasing the thickness of metal layers in the motherboard.

DETAILED DESCRIPTION

Figure 1:
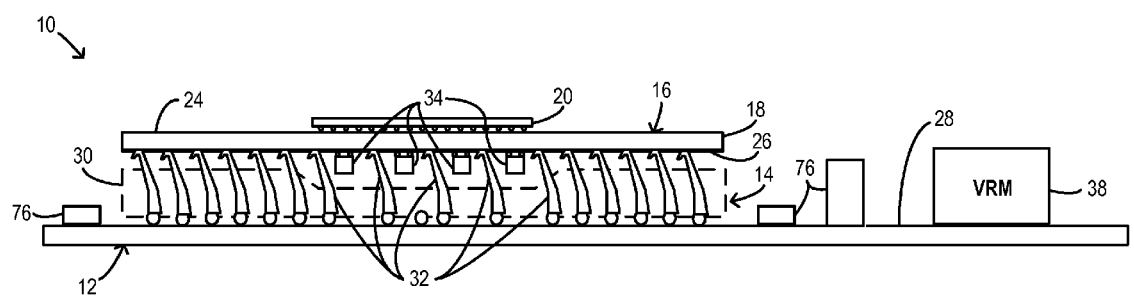
FIG. 1 is a schematic side view of a motherboard that includes an integrated circuit (IC) package according to some embodiments.

FIG. 1 is a schematic side view of a motherboard 10 according to some embodiments. The motherboard 10 includes a circuit board substrate 12, and an IC socket 14 mounted on the circuit board substrate 12. The motherboard 10 also includes an IC package 16 installed in the IC socket 14. The IC package 16, in turn, includes a package substrate 18 and an IC die (e.g., a microprocessor die) 20 mounted on the package substrate 18. In particular, the IC die 20 is mounted via die bumps 22 (best seen in FIG. 2) on the die side 24 of the package substrate 18, the die side 24 being the opposite side from the circuit board substrate 12. The package substrate 18 also has a land side 26 (FIGS. 1 and 2) which is opposite the die side 24 and which faces the upper side 28 of the circuit board substrate 12.

Figure 2:
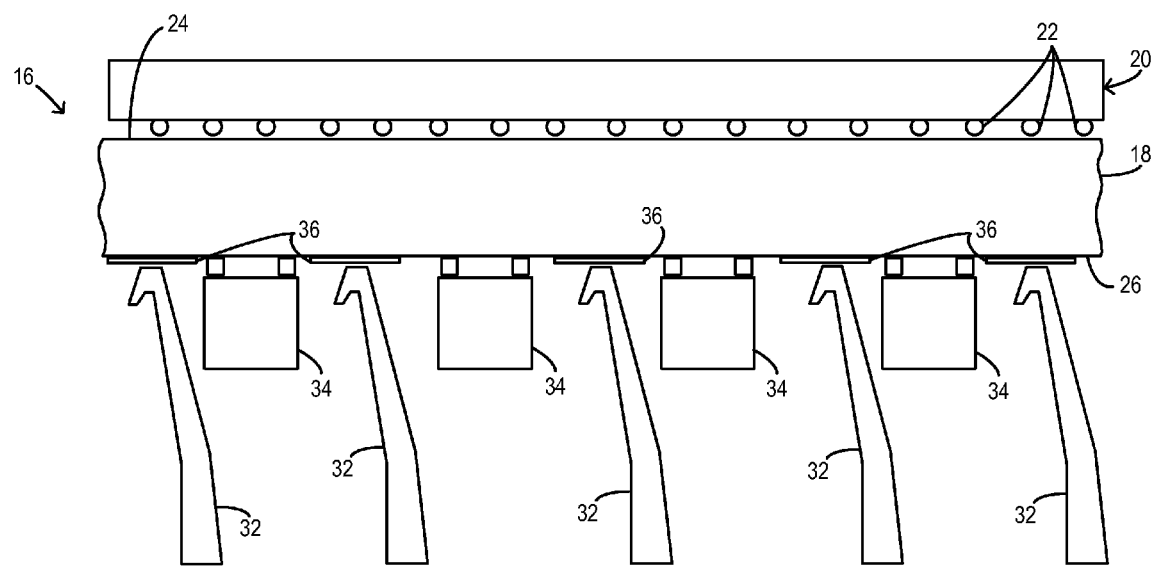
FIG. 2 is a partial schematic side view showing some details of the IC package of FIG. 1.

The IC socket 14 includes a socket body (indicated in phantom at 30) and LGA (land grid assembly) leads 32 by which electrical connections are made from the circuit board substrate 12 to the package substrate 18. Referring now particularly to FIG. 2, the IC package 16 includes land-side capacitors 34 mounted on the land side 26 of the package substrate 18. As best recognized from FIG. 1, the land side capacitors 34 are positioned in a location that is centrally located on the land side 26 of the package substrate 18, and the IC die 20 is mounted in a location that is centrally located on the die side 24 of the package substrate 18.

Referring once more to FIG. 2, the IC package 16 also includes conductive contact pads 36 formed on the land side 26 of the package substrate 18. The conductive contact pads 36 are interspersed among the land-side capacitors 34, and are contacted by some of the LGA leads 32 to connect the IC die 20 with a power supply voltage provided by a voltage regulation module (VRM) 38 (FIG. 1) that is mounted on the circuit board substrate 12.

Figure 3A:
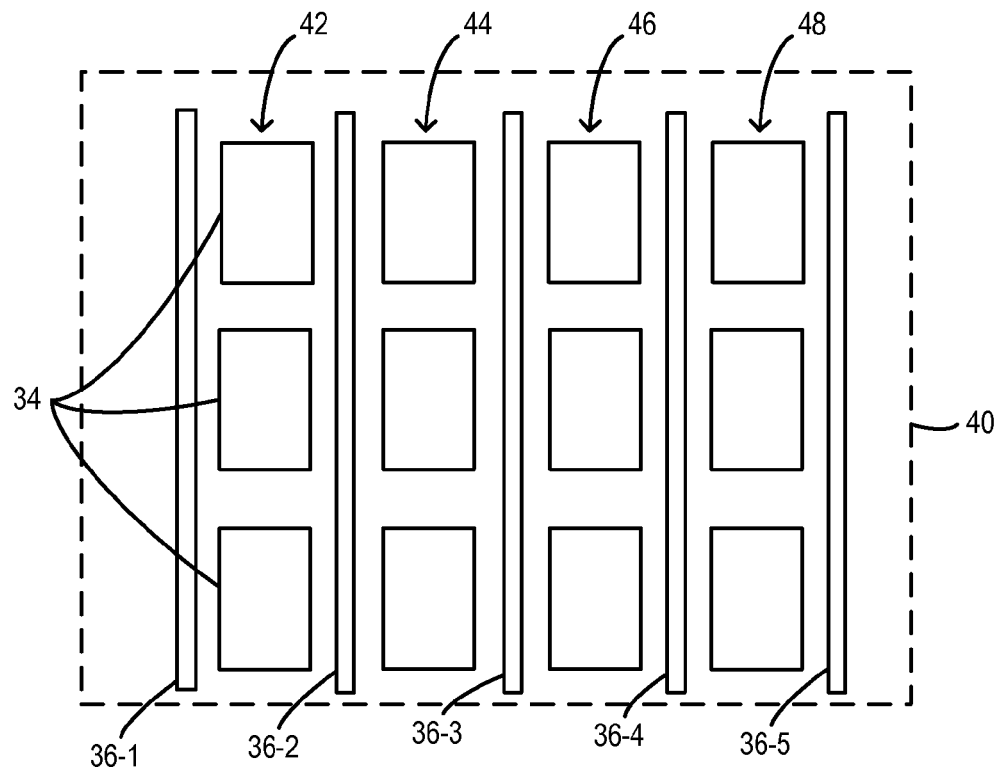
FIGS. 3A-3D are inverted schematic plan views showing example layouts of a central portion of the land-side of the package substrate of the IC package of FIGS. 1 and 2, according to some embodiments.

FIG. 3A is a schematic inverted plan view that illustrates an example of a layout of the land-side capacitors 34 and the conductive contact pads 36 on the land side of the package substrate according to some embodiments. In FIG. 3A, a dashed-line box 40 is indicative of a central region on the land side of the package substrate, the central region corresponding to the locus of the cavity that is provided in conventional IC sockets to accommodate land-side capacitors.

In the example layout illustrated in FIG. 3A, the conductive contact pads consist of five elongated rectangular conductive contact pads 36-1 to 36-5. More specifically, proceeding from left to right in the drawing, the example layout includes:

(a) a first conductive contact pad 36-1 at the left hand side of the layout;

(b) a first column 42 of three land-side capacitors 34, the column 42 extending parallel to and adjacent to the first conductive contact pad 36-1;

(c) a second conductive contact pad 36-2 extending parallel to the first conductive contact pad 36-1 and on the opposite side of the column 42 of land-side capacitors from the first conductive contact pad 36-1;

(d) a second column 44 of three land-side capacitors, the column 44 extending parallel to and adjacent to the second conductive contact pad 36-2 and on the opposite side of the second conductive contact pad 36-2 from the column 42 of land-side capacitors;

(e) a third conductive contact pad 36-3 extending parallel to the first and second conductive contact pads 36-1 and 36-2 and on the opposite side of the column 44 of land-side capacitors from the second conductive contact pad 36-2;

(f) a third column 46 of three land-side capacitors, the column 46 extending parallel to and adjacent to the third conductive contact pad 36-3 and on the opposite side of the third conductive contact pad 36-3 from the column 44 of land-side capacitors 34;

(g) a fourth conductive contact pad 36-4 extending parallel to the first, second and third conductive contact pads 36-1 to 36-3 and on the opposite side of the column 46 of land-side capacitors from the third conductive contact pad 36-3;

(h) a fourth column 48 of three land-side capacitors, the column 48 extending parallel to and adjacent to the fourth conductive contact pad 36-4 and on the opposite side of the fourth conductive contact pad 36-4 from the column 46 of land-side capacitors 34; and (i) a fifth conductive contact pad 36-5 extending parallel to the first, second, third and fourth conductive contact pads 36-1 to 36-4 and on the opposite side of the column 48 of land-side capacitors from the fourth conductive contact pad 36-4.

As seen from FIG. 3A, the conductive contact pads 36 are interspersed among the land-side capacitors, and it may also be said that the capacitors are interspersed among the conductive contact pads 36. In this layout, the land-side capacitors remain near the IC die 20 (FIGS. 1 and 2)—i.e., just on the other side of the package substrate 18—so that the capacitors are well-positioned to minimize first droop noise. The elongated conductive contact pads may be contacted with LGA leads along the lengths of the contact pads to provide many parallel conductive paths from the VRM to the IC die, thereby lowering total path resistance as compared with conventional IC package arrangements. The lowered total path resistance may result in improved third droop noise performance.

In this and in some other example embodiments shown therein, columns of capacitors include three capacitors, but in other embodiments at least some columns may have more or fewer than three capacitors.

Figure 3B:
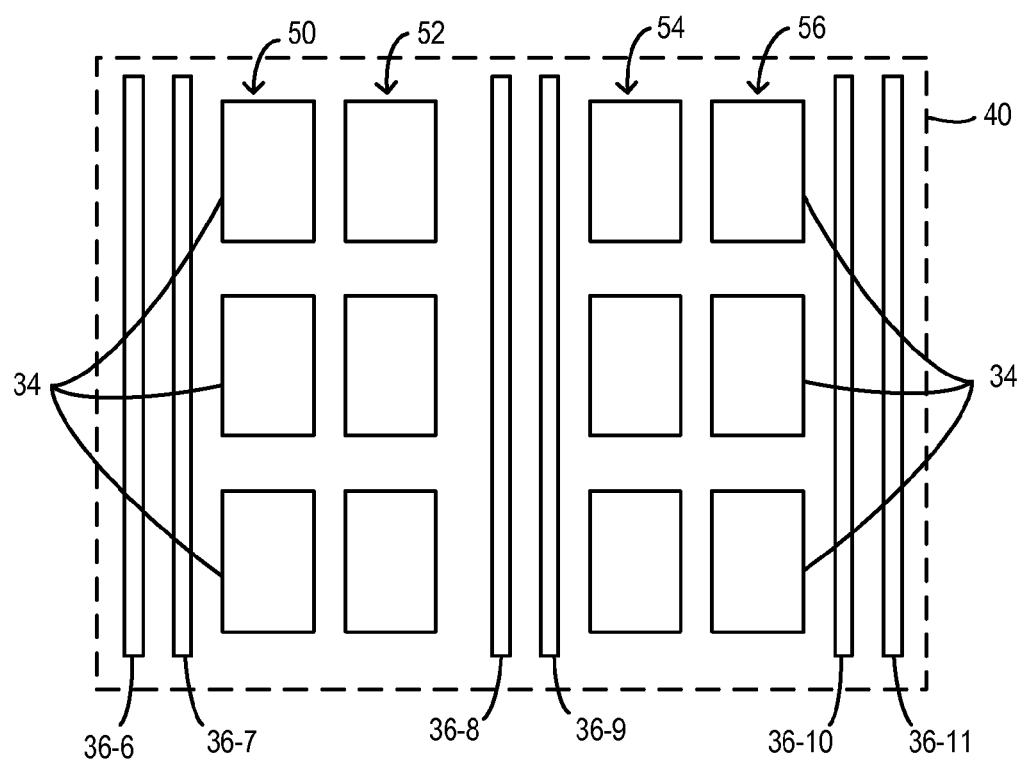
Figure 3C:
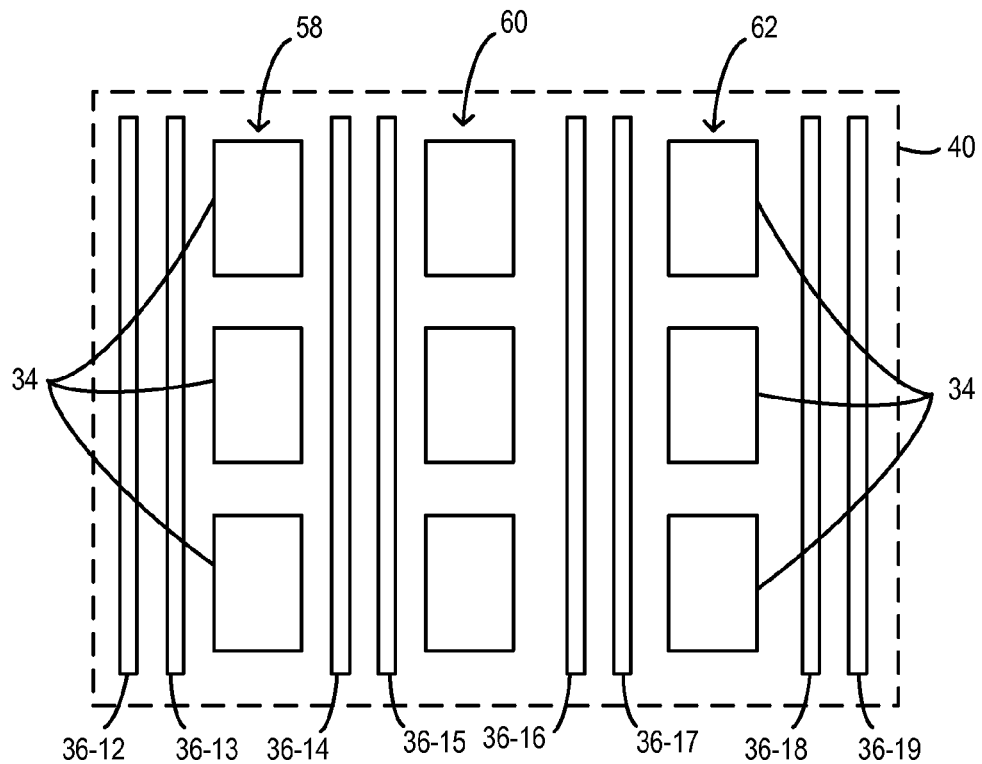
Figure 3D:
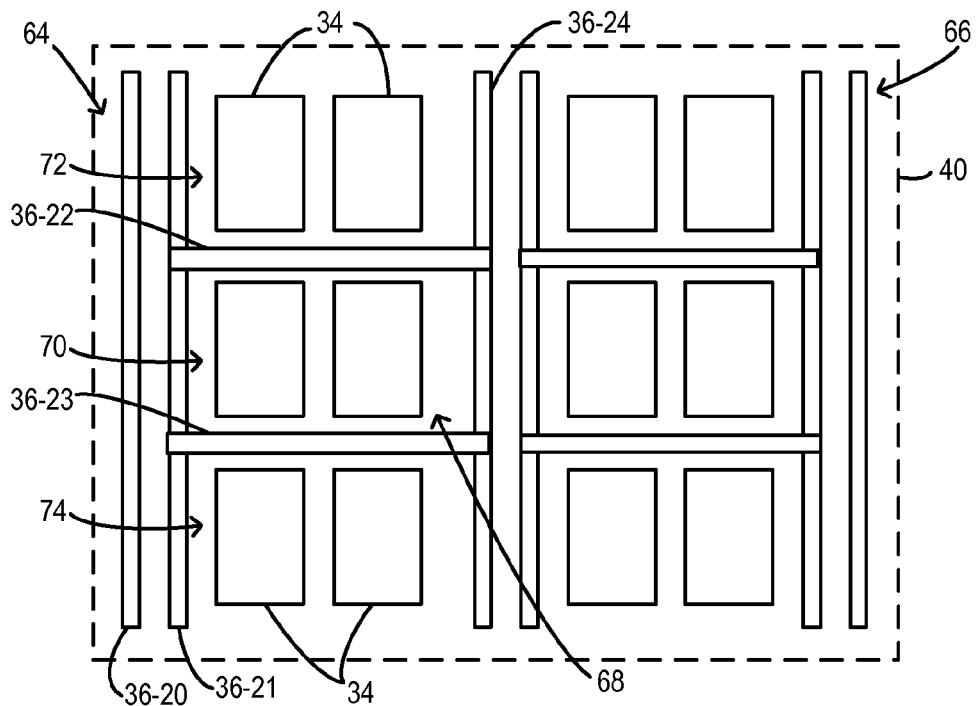

It should be understood that there may be many alternative layouts of conductive contact pads and land-side capacitors on the land side of the package substrate according to alternative embodiments, with the conductive contact pads interspersed among the capacitors and/or the capacitors interspersed among the conductive contact pads. FIGS. 3B-3D present examples of such alternative layouts. For example, in the embodiment illustrated in FIG. 3B the layout includes, proceeding from left to right:

(a) a first conductive contact pad 36-6 at the left hand side of the layout;

(b) a second conductive contact pad 36-7 extending parallel to and adjacent to the first conductive contact pad. 36-6;

(c) a first column 50 of three land-side capacitors 34, the column 50 extending parallel to and adjacent to the second conductive contact pad 36-7 and on the opposite side of the second conductive contact pad 36-7 from the first conductive contact pad 36-6;

(d) a second column 52 of three land-side capacitors 34, the column 52 extending parallel to and adjacent to the first column 50 and on the opposite side of the first column 50 from the second conductive contact pad 36-7;

(e) a third conductive contact pad 36-8 extending parallel to and adjacent to the second column 52 of capacitors and on the opposite side of the second column 52 from the first column 50;

(f) a fourth conductive contact pad 36-9 extending parallel to and adjacent to the third conductive contact pad 36-8 and on the opposite side of the third conductive contact pad 36-8 from the second column 52 of capacitors;

(g) a third column 54 of three land-side capacitors, the column 54 extending parallel to and adjacent to the fourth conductive contact pad 36-9 and on the opposite side of the fourth conductive contact pad 36-9 from the third conductive contact pad 36-8;

(h) a fourth column 56 of three land-side capacitors, the column 56 extending parallel to and adjacent to the third column 54 and on the opposite side of the third column 54 from the fourth conductive contact pad 36-9;

(i) a fifth conductive contact pad 36-10 extending parallel to and adjacent to the fourth column 56 of capacitors and on the opposite side of the fourth column 56 from the third column 54; and (j) a sixth conductive contact pad 36-11 extending parallel to and adjacent to the fifth conductive contact pad 36-10 and on the opposite side of the fifth conductive contact pad 36-10 from the fourth column 56 of capacitors.

In the embodiment illustrated in FIG. 3C, the layout includes, proceeding from left to right:

(a) a first conductive contact pad 36-12 at the left hand side of the layout;

(b) a second conductive contact pad 36-13 extending parallel to and adjacent to the first conductive contact pad 36-12;

(c) a first column 58 of three land-side capacitors 34, the column 58 extending parallel to and adjacent to the second conductive contact pad 36-13 and on the opposite side of the second conductive contact pad 36-13 from the first conductive contact pad 36-12;

(d) a third conductive contact pad 36-14 extending parallel to and adjacent to the first column 58 of capacitors and on the opposite side of the first column 58 from the second conductive contact pad 36-13;

(e) a fourth conductive contact pad 36-15 extending parallel to and adjacent to the third conductive contact pad 36-14 and on the opposite side of the third conductive contact pad 36-14 from the first column 58 of capacitors;

(f) a second column 60 of three land-side capacitors, the column 60 extending parallel to and adjacent to the fourth conductive contact pad 36-15 and on the opposite side of the fourth conductive contact pad 36-15 from the third conductive contact pad 36-14;

(g) a fifth conductive contact pad 36-16 extending parallel to and adjacent to the second column 60 of capacitors and on the opposite side of the second column 60 from the fourth conductive contact pad 36-15;

(h) a sixth conductive contact pad 36-17 extending parallel to and adjacent to the fifth conductive contact pad 36-16 and on the opposite side of the fifth conductive contact pad 36-16 from the second column 60 of capacitors;

(i) a third column 62 of three land-side capacitors, the column 62 extending parallel to and adjacent to the sixth conductive contact pad 36-17 and on the opposite side of the sixth conductive contact pad 36-17 from the fifth conductive contact pad 36-16;

(j) a seventh conductive contact pad 36-18 extending parallel to and adjacent to the third column 62 of capacitors and on the opposite side of the third column 62 from the sixth conductive contact pad 36-19; and (k) an eighth conductive contact pad 36-19 extending parallel to and adjacent to the seventh conductive contact pad 36-18 and on the opposite side of the seventh conductive contact pad 36-18 from the third column 62 of capacitors.

In the embodiment illustrated in FIG. 3D, the layout includes a left-hand section 64 of conductive contact pads and capacitors and a right-hand section 66 of conductive contact pads and capacitors. The left-hand section 64 includes:

(a) a first conductive contact pad 36-20 at the left hand side of the left-hand section 64;

(b) a second conductive contact pad 36-21 extending parallel to and adjacent to the first conductive contact pad 36-20;

(c) a third conductive contact pad 36-22 joined to the second conductive contact pad 36-21 about one-third of the way along the second conductive contact pad 36-21 and extending at a right angle away from the second conductive contact pad 36-21 and away from the first conductive contact pad 36-20;

(d) a fourth conductive contact pad 36-23 joined to the second conductive contact pad 36-21 about two-thirds of the way along the second conductive contact pad 36-21 and extending parallel to the third conductive contact pad 36-22 away from the second conductive contact pad 36-21 and away from the first conductive contact pad 36-20;

(e) a fifth conductive contact pad 36-24 extending parallel to the first and second conductive contact pads 36-20 and 36-21 and joined to the opposite ends of the third and fourth conductive contact pads 36-22 and 36-23 from the second conductive contact pad 36-21 to enclose with the conductive contact pads 36-21, 36-22 and 36-23 a rectangular area 68;

(f) a first pair 70 of land-side capacitors located in the rectangular area 68;

(g) a second pair 72 of land-side capacitors located adjacent the third conductive contact pad 36-22 and on the opposite side of the third conductive contact pad 36-22 from the first pair 70 of capacitors; and (h) a third pair 74 of land-side capacitors located adjacent the fourth conductive contact pad 36-23 and on the opposite side of the fourth conductive contact pad 36-23 from the first pair 70 of capacitors.

The right-hand section 66 of conductive contact pads and capacitors is a mirror image of the left-hand section 64 and so need not be described further.

In other embodiments, the conductive contact pads need not be rectangular, but instead may be, for example, circular or oval. For example, in some embodiments, some or all of the elongate rectangular conductive contact pads shown in FIGS. 3A-3D may be replaced with a sequence of small circular or oval pads, or alternatively with a sequence of small rectangular pads.

Referring once more to FIG. 1, it will be noted that the circuit board substrate 12 has mounted thereon a number of on-board capacitors 76 as well as the above-mentioned VRM 38, In addition, the circuit board substrate may have other conventional components (not shown) mounted thereon, such as memory devices, for example. Also, although not explicitly indicated in the drawings, each of the circuit board substrate 12 and the package substrate 18 (FIG. 2) may include one or more layers of traces, in accordance with conventional practices, to provide signal paths between components of the motherboard 10.

It will be appreciated from the foregoing that assembly of the motherboard 10 may entail providing the motherboard, including the socket 14 and the power supply/VRM 38; providing the IC package 16; and connecting the IC package 16 to the socket 14 so that the IC die 20 is coupled to the power supply 38 via the conductive contact pads 36 and via the socket 14.

Figure 4:
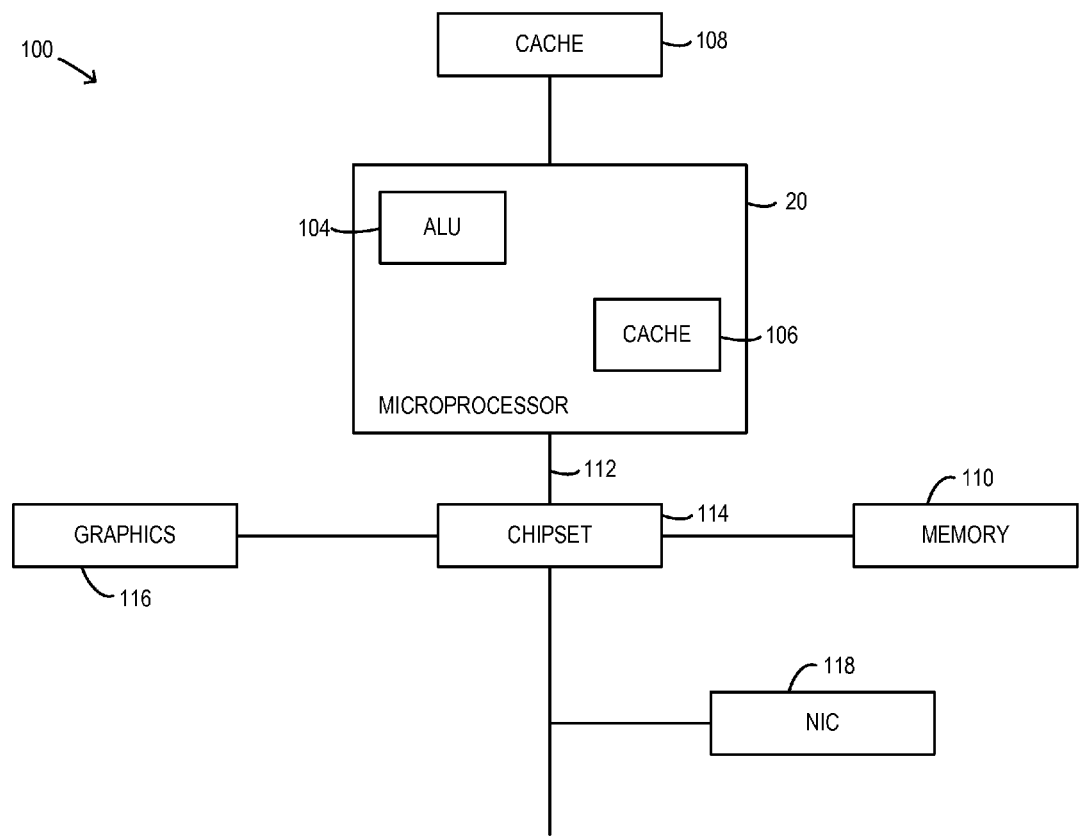
FIG. 4 is a block diagram of a computer system that includes an example of an IC package as in one or more of FIGS. 1-3D.

FIG. 4 is a block diagram of a computer system 100 that includes a microprocessor die 20 packaged as in one or more of FIGS. 1-3D. The microprocessor die 20 includes many sub-blocks, such as arithmetic logic unit (ALU) 104 and on-die cache 106. Microprocessor 20 may also communicate to other levels of cache, such as off-die cache 108. Higher memory hierarchy levels, such as system memory 110, are accessed via host bus 112 and chipset 114. In addition, other off-die functional units, such as graphics accelerator 116 and network interface controller (NIC) 118, to name just a few, may communicate with microprocessor 20 via appropriate busses or ports. In some embodiments, the system may include more than one microprocessor.

The die packaging arrangements disclosed herein may be applied to packaging of other types of IC die in addition to microprocessors.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
 a circuit board;
 a socket mounted on the circuit board, the socket including a plurality of land grid assembly (LGA) leads;
 an integrated circuit (IC) package installed in the socket, the IC package including:
  a substrate;
  an IC die mounted on a first side of the substrate;
  a plurality of capacitors mounted on a second side of the substrate, the second side opposite to the first side;
  a plurality of conductive contact pads formed on the second side of the substrate and interspersed among the capacitors; and
 a voltage regulation module mounted on the circuit board and electrically coupled to the conductive contact pads via the LGA leads of the socket to supply a power supply voltage to the IC die, the conductive contact pads contacted by the LGA leads.

2. The apparatus of claim 1, wherein the capacitors and conductive contact pads are positioned in a location that is centrally located on the second side of the substrate.

3. The apparatus of claim 2, wherein the IC die is mounted in a location that is centrally located on the first side of the substrate.

\* \* \* \* \*